(12) United States Patent
Chiba et al.

(10) Patent No.: US 11,283,374 B2
(45) Date of Patent: Mar. 22, 2022

(54) METHOD FOR MANUFACTURING DIELECTRIC ELASTOMER TRANSDUCER

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Masakatsu Hotta, Annaka (JP); Kazuhiro Oishi, Annaka (JP)

(73) Assignees: Seiki Chiba, Tokyo (JP); Mikio Waki, Sakura (JP); ZEON CORPORATION, Tokyo (JP)

(*) Notice: Subject to any disclaimer, the term of this patent is extended or adjusted under 35 U.S.C. 154(b) by 126 days.

(21) Appl. No.: 16/963,829

(22) PCT Filed: Jan. 11, 2019

(86) PCT No.: PCT/JP2019/000671
§ 371 (c)(1),
(2) Date: Jul. 22, 2020

(87) PCT Pub. No.: WO2019/146429
PCT Pub. Date: Aug. 1, 2019

(65) Prior Publication Data
US 2021/0058013 A1  Feb. 25, 2021

(30) Foreign Application Priority Data
Jan. 26, 2018 (JP) .............................. JP2018-011629

(51) Int. Cl.
*H02N 11/00* (2006.01)
*H01L 41/193* (2006.01)

(52) U.S. Cl.
CPC ........... *H02N 11/00* (2013.01); *H01L 41/193* (2013.01)

(58) Field of Classification Search
CPC ... H02N 11/00; H01L 41/193; H01L 41/0536; H01L 41/253
See application file for complete search history.

(56) References Cited

U.S. PATENT DOCUMENTS

| 6,543,110 | B1 | 4/2003 | Pelrine et al. |
| 2009/0127979 | A1* | 5/2009 | Takeuchi ............ H01L 41/0836 310/328 |
| 2017/0279031 | A1* | 9/2017 | Yoo ........................ H01L 41/25 |

FOREIGN PATENT DOCUMENTS

| JP | 2009124875 A | 6/2009 |
| JP | 2016201995 A | 12/2016 |
| JP | 2017028769 A | 2/2017 |

OTHER PUBLICATIONS

Apr. 16, 2019, International Search Report issued in the International Patent Application No. PCT/JP2019/000671.

(Continued)

*Primary Examiner* — Michael C Zarroli
(74) *Attorney, Agent, or Firm* — Kenja IP Law PC

(57) ABSTRACT

A method is provided for manufacturing a dielectric elastomer transducer including a dielectric elastomer layer and electrode layers sandwiching the elastomer layer. The elastomer layer when stretched exhibits a stress-strain curve having: a low strain and high elasticity region; a low elasticity region; and a high strain region. The method includes: a pre-stretching process to reduce hysteresis in elastic behavior of the elastomer layer by stretching the elastomer layer one or more times under a load as heavy as a first load before the electrodes are provided, each stretching causing the elastomer layer to undergo a tension falling in the low elasticity region; and a dielectric elastomer layer fixing process including applying a second load smaller than (Continued)

the first load to the elastomer layer so as to fix the elastomer layer to a support member under a second tension smaller than the first tension.

4 Claims, 3 Drawing Sheets

(56)  References Cited

OTHER PUBLICATIONS

Sep. 8, 2021, the Extended European Search Report issued by the European Patent Office in the corresponding European Patent Application No. 19743804.7.
Guggi Kofod, The static actuation of dielectric elastomer actuators: how does pre-stretch improve actuation?, Journal of Physics D: Applied Physics, 2008, vol. 41, 215405, XP020141011.
Philipp Gaida et al., Viscoelastic medelling and experimental results of a dielectric electro-active polymer diaphragm actuator, Proceedings of Applied Mathematical Mechanics, 2014, pp. 475-476, vol. 14, XP055835269.

\* cited by examiner (a) Working Example (b) Comparative Example

METHOD FOR MANUFACTURING DIELECTRIC ELASTOMER TRANSDUCER

TECHNICAL FIELD

The present invention relates to a method for manufacturing a dielectric elastomer transducer.

BACKGROUND ART

As transducers with excellent energy conversion efficiency, dielectric elastomer transducers having dielectric elastomer layers are attracting attention. Such a dielectric elastomer transducer converts one form of energy into another by using deformation (expansion and contraction) of the dielectric elastomer layer.

For example, the dielectric elastomer layer to be deformed by applying an external force may be used to generate electric power, thereby converting mechanical energy into electrical energy. In this case, the dielectric elastomer transducer acts as a power generator. In another example, the dielectric elastomer layer to be deformed by electric charges induced on a pair of electrodes may be used to generate driving force. In this case, the dielectric elastomer transducer acts as an actuator.

For the dielectric elastomer transducer to improve the efficiency of actuation or power generation, it is preferable to cause the dielectric elastomer layer to expand and contract a greater amount. However, dielectric elastomer layers are made of highly flexible materials, which are unlike solid, such as metal, or liquid. Therefore, substantially deforming a dielectric elastomer may degrade the reproducibility in operation, which has been recognized as a problem.

PRIOR ART DOCUMENTS

Patent Documents
  Patent Document 1: JP-A-2009-124875

SUMMARY OF THE INVENTION

Technical Problem

The present invention has been conceived in view of the circumstances noted above and aims to provide a method for manufacturing a dielectric elastomer transducer that operates with high repeatability.
Solution to Problem The present invention provides a method for manufacturing a dielectric elastomer transducer including a dielectric elastomer layer and a pair of electrode layers sandwiching the dielectric elastomer layer, where the dielectric elastomer layer when stretched exhibits a stress-strain curve having: a low strain and high elasticity region in which the curve includes a zero-strain point and has a relatively large slope; a low elasticity region connected to a higher strain side of the low strain and high elasticity region and in which the curve has a relatively small slope; and a high strain region connected to a higher strain side of the low elasticity region and in which the curve has a relatively large slope or includes a rupture point. The method includes: a pre-stretching process to reduce hysteresis in elastic behavior of the dielectric elastomer layer, where the pre-stretching process includes stretching the dielectric elastomer layer one or more times by applying a load that is at least as heavy as a first load to the dielectric elastomer layer before the pair of electrodes are provided, each stretching causing the dielectric elastomer layer to undergo a first tension falling in the low elasticity region; and a dielectric elastomer layer fixing process following the pre-stretching process and including applying a second load smaller than the first load to the dielectric elastomer layer, so that the dielectric elastomer layer is fixed to a support member while undergoing a second tension smaller than the first tension.

According to a preferred embodiment of the present invention, the dielectric elastomer layer fixing process includes reducing the first tension to the second tension in the dielectric elastomer layer after a last stretching in the pre-stretching process.

According to a preferred embodiment of the present invention, the stretching is performed only once in the pre-stretching process.
Advantageous Effects of Invention The present invention enables the manufacture of a dielectric elastomer transducer that operates with high repeatability.

Other features and advantages of the present invention will be more apparent from detailed description given below with reference to the accompanying drawings.

MODE FOR CARRYING OUT THE INVENTION

Preferred embodiments of the present invention are described below with reference to the accompanying drawings.

Figure 1:
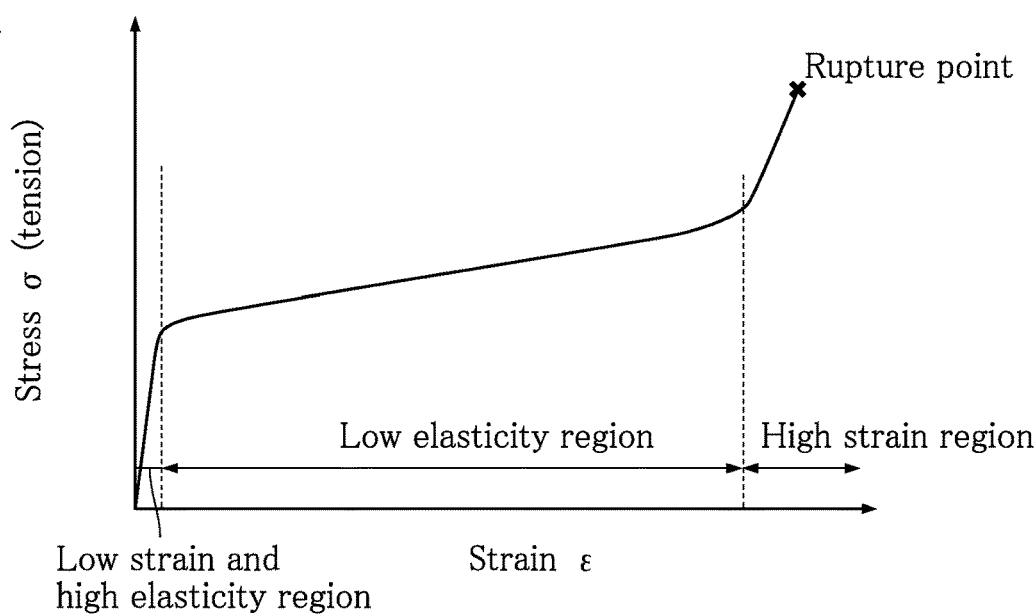
FIG. 1 is a graph of a stress-strain curve of a dielectric elastomer layer.

FIG. 1 shows an example of a stress-strain curve of a dielectric elastomer layer used for a dielectric elastomer transducer according to the present invention.

The dielectric elastomer layer contains one or more elastomers (polymers having rubbery elasticity). The elastomers are not limited to any specific types and may be thermoset elastomers, thermoplastic elastomers and energy ray-curable elastomers, for example.

The thermoset elastomers are not limited to any specific types and may be natural rubbers, synthetic rubbers, silicone rubber elastomers, urethane rubber elastomers and fluorocarbon rubber elastomers, for example.

The thermoplastic elastomers are not limited to any specific types and may be styrene elastomers, olefinic elastomers, vinyl chloride elastomers, urethane elastomers, amide elastomers and ester elastomers, for example. A vinyl chloride elastomer may be polyvinyl chloride (PVC), for example.

An energy ray-curable elastomer is curable by one or more energy rays. The energy rays are not limited to any specific types and may be radio waves, ultraviolet radiation, visible light and infrared radiation, for example. More specifically, the energy rays may be electromagnetic energy rays and high energy rays. Among the energy rays, light (wavelengths=200 nm to 700 nm) may be emitted from sources, including ultra-high pressure mercury lamps, high-pressure mercury lamps, medium-pressure mercury lamps, low-pressure mercury lamps, mercury vapor arc lamps, xenon arc lamps, carbon arc lamps, metal halide lamps, fluorescent lamps, tungsten lamps, excimer lamps, germicidal lamps, light-emitting diodes and CRT light sources, for example. Particularly, sources that emit light at wavelengths of 300 nm to 450 nm are preferable, such as ultra-high-pressure mercury lamps, mercury vapor arc lamps, carbon arc lamps and xenon arc lamps. Examples of radio waves include those in the industrial, scientific and medical (ISM) bands stipulated by Radio Act and also include those in the 915 MHz band, which is used in Europe and America. Examples of high energy rays include electron beams, x rays and radioactive rays.

Note that the dielectric elastomer layer may include one or more other materials in addition to the elastomers noted above. Examples of such other materials include various additives.

With reference to FIG. 1, the horizontal axis represents a strain $\epsilon$, which is a one-dimensional strain in a longitudinal direction of a band-shaped dielectric elastomer layer when it is deformed in the longitudinal direction. The dielectric elastomer layer may have any variety of shape, so that the expansion direction may be in one dimension or two or more dimensions. When a dielectric elastomer layer is expanded in two dimensions, the strain $\epsilon$ refers to a strain in the characteristic length, which is appropriately determined depending on the shape and expansion direction of the dielectric elastomer layer.

The present inventors have conducted research and found that the stress-strain curve of a dielectric elastomer layer includes a low strain and high elasticity region, a low elasticity region, and a high strain region. In the low strain and high elasticity region, the curve includes a point where the strain $\epsilon$ is 0 and has a relatively large slope. In other words, this region corresponds to the state where the elasticity is relatively high. In the low elasticity region, the curve has a smaller slope than in the low strain and high elasticity region. In other words, this region corresponds to the state where the elasticity is relatively low. The high strain region is connected to a higher strain side of the low elasticity region. In one example, the curve in the high strain region has a larger slope than in the low elasticity region. Alternatively, the slope of the curve in the high strain region may not differ notably from the slope of the curve in the low elasticity region, except that the curve may include a rupture point. As a precondition, the method for manufacturing a dielectric elastomer transducer described below uses a dielectric elastomer layer that exhibits such a stress-strain curve. The vertical axis of the graph of the stress-strain curve represents the tension described below.

Figure 2:
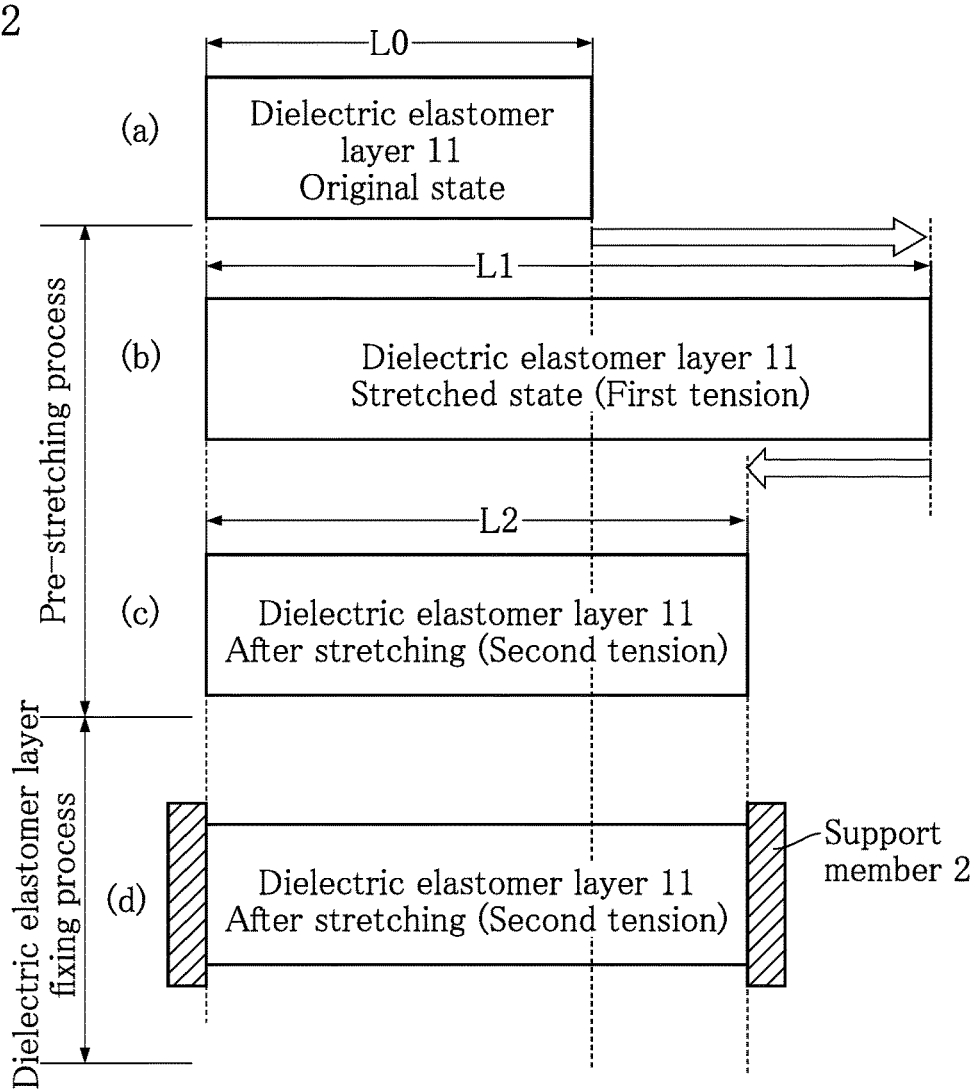
FIG. 2 is a diagram illustrating an example of a method for manufacturing a dielectric elastomer transducer according to the present invention.

FIG. 2 is a diagram schematically illustrating a method for manufacturing a dielectric elastomer transducer according to the present invention. This figure shows a dielectric elastomer layer 11 used for a dielectric elastomer transducer A1 described later. The shape of the dielectric elastomer layer 11 is not limited. In the example given below, the dielectric elastomer layer 11 has an annular shape. In this case, the diametrical length of the dielectric elastomer layer 11 may be a characteristic length. For convenience, however, the figure shows the dielectric elastomer layer 11 in a band shape that expands and contracts in the longitudinal direction (horizontal direction).

First, as shown in FIG. 2(a), a piece of dielectric elastomer is cut from a roll of elastomeric material for forming a dielectric elastomer layer 11. The characteristic length of the dielectric elastomer layer 11 in this state is determined as length L0.

<Pre-Stretching Process>

Then, as shown in FIGS. 2(b) and (c), a pre-stretching process is performed. The pre-stretching process involves stretching the dielectric elastomer layer 11 one or more times. Each stretching is performed by applying a load that is at least as heavy as a first load to the dielectric elastomer layer 11 to exert a first tension. The magnitude of the first tension is such that the resulting strain in the dielectric elastomer layer falls in the low elasticity region. In this example, the stretching is performed only once as shown in FIG. 2(b). As a result of this stretching, the characteristic length of the dielectric elastomer layer 11 is extended to length L1.

Next, as shown in FIG. 2(c), the load applied to the dielectric elastomer layer 11 is reduced from the first load to a second load. As a result, the dielectric elastomer layer 11 is placed in a second tension that is less than the first tension. Accordingly, the characteristic length of the dielectric elastomer layer 11 is reduced to length L2, which is shorter than the length L1 and longer than the length L0.

<Dielectric Elastomer Layer Fixing Process>

Next, as shown in FIG. 2(d), a dielectric elastomer layer fixing process is performed. In this process, while the dielectric elastomer layer 11 is in the second tension and has the characteristic length equal to the length L2, the dielectric elastomer layer 11 is fixed to a support member 2, for example. Since the dielectric elastomer layer 11 is held by the support member 2, even after the second load is removed, the second tension remains present in the dielectric elastomer layer 11 and the characteristic length remains unchanged from the length L2.

Figure 3:
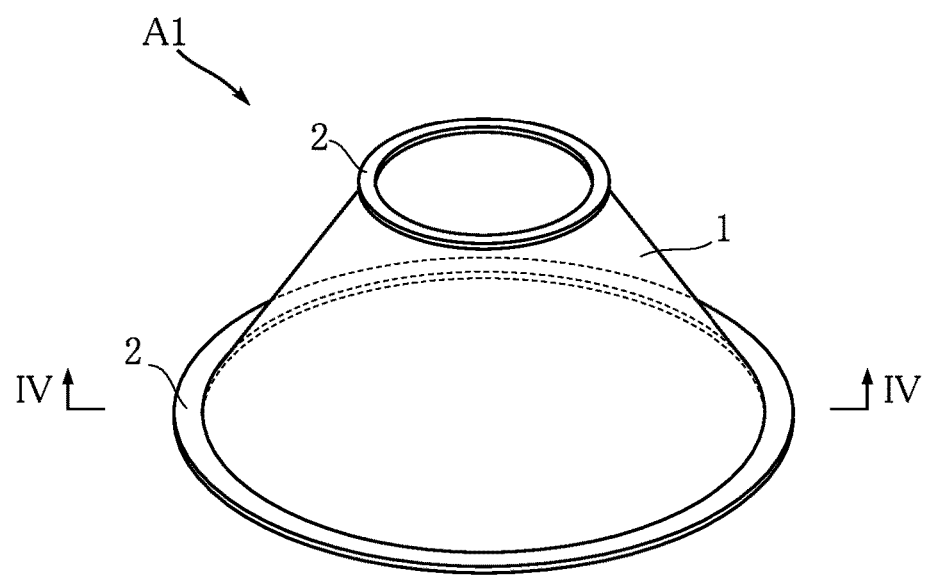
FIG. 3 is a perspective view of an example of a dielectric elastomer transducer according to the present invention.
Figure 4:
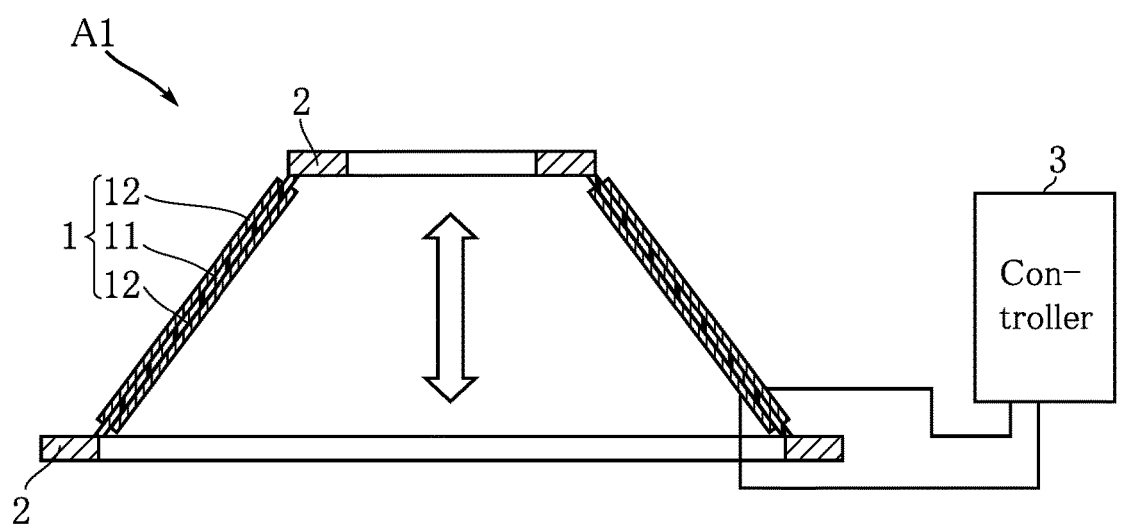
FIG. 4 is a sectional view taken along line IV-IV of FIG. 3.

FIGS. 3 and 4 show an example of a dielectric elastomer transducer manufactured by the method for manufacturing a dielectric elastomer transducer according to the present invention. A dielectric elastomer transducer A1 of this embodiment includes a dielectric elastomer element 1 and support members 2. The dielectric elastomer transducer A1 is connected to a controller 3 for effecting conventionally known control and used for a variety of applications, including actuation, power generation and sensing. When the dielectric elastomer transducer A1 is used for actuation, the controller 3 applies a drive voltage to drive the dielectric elastomer element 1.

The dielectric elastomer element 1 includes a dielectric elastomer layer 11 and a pair of electrode layers 12. The dielectric elastomer layer 11 is made of a material mentioned above and manufactured by the method described above. The pair of electrode layers 12 is disposed to sandwich the dielectric elastomer layer 11.

The electrode layers 12 are made of an electrically conductive material that is elastically deformable following the elastic deformation of the dielectric elastomer layer 11. The material of the electrode layers 12 contain one or more conductive materials, including carbon materials, conductive polymer compounds and metallic materials. Examples of carbon materials include graphite, fullerene, carbon nanotubes (CNTs) and graphene. A carbon material may be subjected to one or more processes, including metal doping, metal-encapsulation and metal plating. Examples of conductive polymer compounds include polyacethylene, polythiophene, polypyrrole, polyphenylene, polyphenylene vinylene and polybenzothiazole. Examples of metallic materials include silver (Ag), gold (Au) and aluminum (Al), as well as alloys of such metals. The pair of electrode layers 12 may be formed either before or after the pre-stretching process and the dielectric elastomer layer fixing process described above.

In the present embodiment, the dielectric elastomer layer 11 has an annular shape, and each of the electrode layers 12 also has an annular shape corresponding to the shape of the dielectric elastomer layer 11. The electrode layers 12, however, may have a different shape from the shape of the dielectric elastomer layer 11.

The support member 2 holds the annular dielectric elastomer element 1 stretched in the up-and-down direction. The material of the support member 2 is not limited and an insulating material, such as a glass epoxy resin, may be used. The dielectric elastomer element 1 is held by the support member 2 so as to form a frustoconical shape.

The controller 3 is wired to the pair of electrode layers 12.

The following describes advantages of a dielectric elastomer transducer manufactured by the method for manufacturing a dielectric elastomer transducer shown in FIG. 2. The description is given with reference to a working example using a sample of the dielectric elastomer layer 11 and a comparative example.

As an elastomeric material for a sample of the dielectric elastomer layer 11, a roll of silicone rubber was prepared. Specifically, KE-1950-10-A/B (available from Shin-Etsu Chemical Co., Ltd.) was selected as the material for the sample. The sample was a 1.0 mm thick specimen in a No. 2 dumbbell shape specified in JIS K 6251.

Working Example

The length L0 of the sample was set to 65 mm, and the opposite ends of the sample were fixed. Thus, the distance between the fixed points was equal to the length L0 (65 mm).

In the pre-stretching process, the sample was stretched to the length L1, which was set to 260 mm. In this case, the strain ϵ was 300%. The tensile rate was set to 100 mm/min. This tensile rate corresponds to a strain rate of 154%/min. Thereafter, the sample was allowed to shrink back to the length L2, which was set to 75 mm.

In the dielectric elastomer layer fixing process, the ends of the sample having the length L2 were fixed. In this example, the sample was fixed by a test machine used in the pre-stretching process descried above, instead of fixing by the support member 2.

Then, the sample was repeatedly stretched (twice) to simulate the actual use. In each stretching, the sample was stretched to the length L3, which was set to 225 mm. In other words, the length L3 was shorter than the length L1, and the strain was 200% relative to the strain at the length L2.

Comparative Example

Similarly to the working example, a sample was prepared to have the length L0 equal to 65 mm, and the ends of the sample were fixed.

Then, without the pre-stretching process, the sample was stretched to the length L2, which was set to 75 mm. Then, the sample was repeatedly stretched (twice) to simulate the actual use. Similarly to the working example, the sample was stretched to the length L3 each time. Similarly to the working example, the length L3 was set to 225 mm.
<Results of Stretching>

Figure 5:
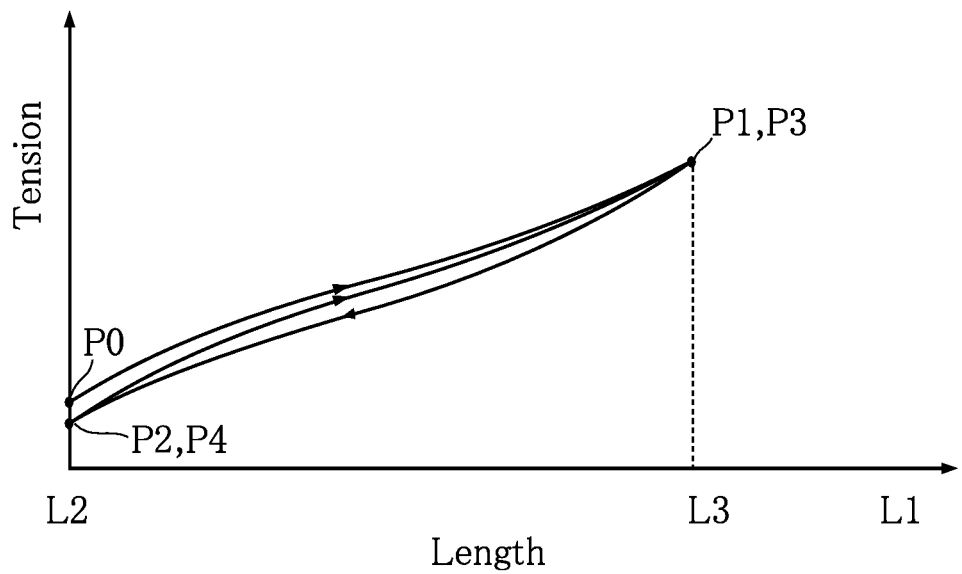
FIG. 5 shows graphs of stress-strain curves (length-tension diagrams), one for a working example and another for a comparative example.
Figure 5:
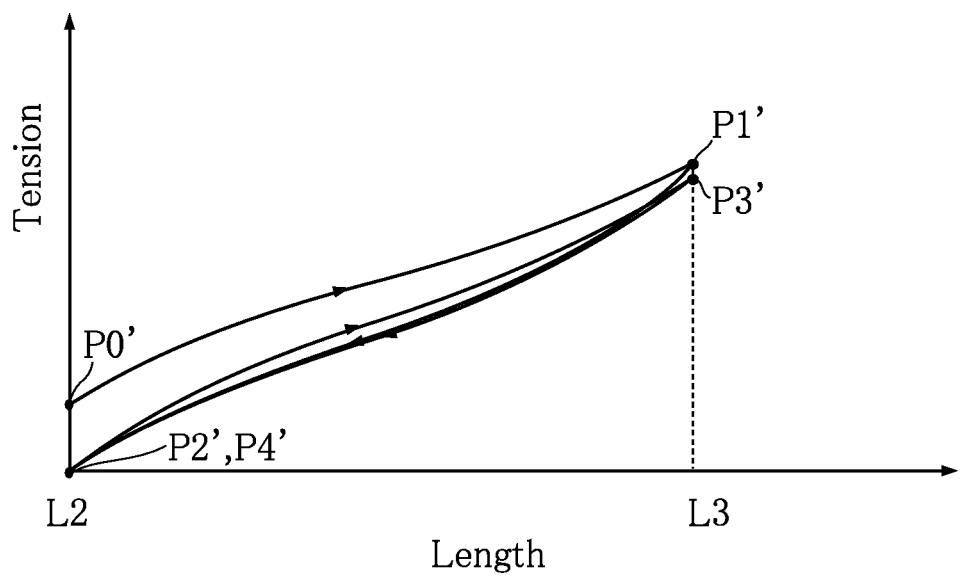

FIG. 5 shows the results of stretching in the working example and the comparative example. FIG. 5(a) shows the results of the working example, whereas FIG. 5(b) shows the results of the comparative example.

As shown in FIG. 5(a), the sample of the working example was fixed to have the length L2 (point P0), stretched to the length L3 for the first time (point P1), and then allowed to shrink back to the length L2 (point P2). In this state, a tension was present in the sample. Thereafter, the sample was stretched to the length L3 for the second time (point P3) and then allowed to shrink back to the length L2 (point P4). In this state, a tension was still present in the sample. In addition, the points P1 and P3 substantially coincide, and the points P2 and P4 substantially coincide. Then, while the sample was in the state corresponding to the point P4, the fixed ends of the sample were released and the sample recovered a length substantially equal to the length L0 (65 mm).

In contrast, as shown in FIG. 5(b), the tension in the sample of the comparative example was equal to 0 after the sample was fixed to have the length L2 (point P0'), stretched to the length L3 for the first time (point p1') and then allowed to shrink back to the length L2 (point P2'). Thereafter, the sample was stretched to the length L3 for the second time (point P3') and then allowed to shrink back to the length L2 (point P4'). In this state, the tension in the sample was equal to 0, as in the state corresponding to the point P3'. It is also noted that the points P1' and P3' are spaced apart from each other as compared to the points P1 and P3 observed in the working example.

As can be understood from FIG. 5, the sample of the working example was in tension after the sample was repeatedly stretched and released back to the length L2 as expected in the actual use of the dielectric elastomer transducer A1. This demonstrates that the dielectric elastomer transducer A1 can be used repeatedly, without causing the dielectric elastomer layer 11 to be undesirably loose or causing unintentional changes in the magnitude of tension produced. In addition, the good agreement between the points P1 and P3 demonstrates the high repeatability of operation of the dielectric elastomer transducer A1.

In contrast, in the dielectric elastomer transducer of the comparative example, the tension in the dielectric elastomer layer was equal to 0 at the length L2 after the stretching performed to simulate the actual use. In other words, the dielectric elastomer layer 11 of the comparative example will be loose or the magnitude of tension produced will change substantially. The comparative example is therefore not preferable for ensuring accurate operations.

It is assumed that the pre-stretching process of the working example contributes to the high repeatability of operation. In the working example, the pre-stretching process was performed to stretch the sample to the length L1, which is longer than the length L3. This elongation corresponds to the elongation expected in the actual use. This is assumed effective to prevent the sample from becoming loose even if it is stretched (to the length L3) as expected in the actual use. For the use of the dielectric elastomer transducer A1 as a power-generating element, actuator or the like, the length L3 can be determined in advance in view of the specific mechanism of applying external mechanical energy for power generation or the mechanical structure of producing an actuation stroke. The pre-stretching process is preferably performed to extend the elastomer layer to the length L1, which is obviously longer than the length L3 expected during the actual use.

The material of the dielectric elastomer layer 11 is an elastomer, which typically is a silicone rubber. Such a material has both elasticity and viscosity. The elasticity determines the force required to cause deformation depending on the extend of the deformation. The viscosity determines the force required to cause deformation depending on the rate of deformation. As long as the dielectric elastomer layer 11 is made of such a material, the pre-stretching process contributes to enhance the behavioral repeatability, regardless of whether the material is any of thermoset elastomers, thermoplastic elastomers and energy ray-curable elastomers other than silicone rubber.

The present invention is not limited to the method for manufacturing a dielectric elastomer transducer and the dielectric elastomer transducer according to the specific embodiments described above. Various modifications and design changes can be made to the method for manufacturing a dielectric elastomer transducer and the dielectric elastomer transducer according to the present invention.

Clause 1.

A method for manufacturing a dielectric elastomer transducer including a dielectric elastomer layer and a pair of electrode layers sandwiching the dielectric elastomer layer, wherein the dielectric elastomer layer when stretched exhibits a stress-strain curve having: a low strain and high elasticity region in which the curve includes a zero-strain point and has a relatively large slope; a low elasticity region connected to a higher strain side of the low strain and high elasticity region and in which the curve has a relatively small slope; and a high strain region connected to a higher strain side of the low elasticity region and in which the curve has a relatively large slope or includes a rupture point, the method comprising:

a pre-stretching process to reduce hysteresis in elastic behavior of the dielectric elastomer layer, wherein the pre-stretching process includes stretching the dielectric elastomer layer one or more times by applying a load that is at least as heavy as a first load to the dielectric elastomer layer before the pair of electrodes are provided, each stretching causing the dielectric elastomer layer to undergo a first tension falling in the low elasticity region; and a dielectric elastomer layer fixing process following the pre-stretching process and including applying a second load smaller than the first load to the dielectric elastomer layer, so that the dielectric elastomer layer is fixed to a support member while undergoing a second tension smaller than the first tension.

Clause 2.

The method according to Clause 1, wherein the dielectric elastomer layer fixing process comprises reducing the first tension to the second tension in the dielectric elastomer layer after a last stretching in the pre-stretching process.

Clause 3.

The method according to Clause 1 or 2, wherein in the pre-stretching process, the stretching is performed only once.

The invention claimed is:

1. A method for manufacturing a dielectric elastomer transducer including a dielectric elastomer layer and a pair of electrode layers sandwiching the dielectric elastomer layer, wherein the dielectric elastomer layer when stretched exhibits a stress-strain curve having: a low strain and high elasticity region in which the curve includes a zero-strain point and has a relatively large slope; a low elasticity region connected to a higher strain side of the low strain and high elasticity region and in which the curve has a relatively small slope; and a high strain region connected to a higher strain side of the low elasticity region and in which the curve has a relatively large slope or includes a rupture point, the method comprising:

a pre-stretching process to reduce hysteresis in elastic behavior of the dielectric elastomer layer, wherein the pre-stretching process includes stretching the dielectric elastomer layer one or more times by applying a load that is at least as heavy as a first load to the dielectric elastomer layer before the pair of electrodes are provided, each stretching causing the dielectric elastomer layer to undergo a first tension falling in the low elasticity region; and a dielectric elastomer layer fixing process following the pre-stretching process and including applying a second load smaller than the first load to the dielectric elastomer layer, so that the dielectric elastomer layer is fixed to a support member while undergoing a second tension smaller than the first tension.

2. The method according to claim 1, wherein the dielectric elastomer layer fixing process comprises reducing the first tension to the second tension in the dielectric elastomer layer after a last stretching in the pre-stretching process.

3. The method according to claim 1, wherein in the pre-stretching process, the stretching is performed only once.

4. The method according to claim 2, wherein in the pre-stretching process, the stretching is performed only once.

* * * * *